(12) United States Patent
Ouyang

(10) Patent No.: US 7,310,231 B2
(45) Date of Patent: Dec. 18, 2007

(54) HEAT SINK HAVING MAGNET ARRAY FOR MAGNETO-HYDRODYNAMIC HOT SPOT COOLING

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 57 days.

(21) Appl. No.: 11/313,387

(22) Filed: Dec. 21, 2005

(65) Prior Publication Data
US 2007/0139885 A1 Jun. 21, 2007

(51) Int. Cl.
*H05K 7/20* (2006.01)
(52) U.S. Cl. ...................................................... 361/699
(58) Field of Classification Search ............... 361/699, 361/687, 384–385, 388; 165/80.4
See application file for complete search history.

(56) References Cited

U.S. PATENT DOCUMENTS

| 5,309,319 | A | * | 5/1994 | Messina | ...................... | 361/699 |
| 5,355,942 | A | | 10/1994 | Conte | | |
| 5,471,850 | A | * | 12/1995 | Cowans | ...................... | 62/223 |
| 2005/0205241 | A1 | * | 9/2005 | Goodson et al. | ............ | 165/80.4 |
| 2007/0053153 | A1 | * | 3/2007 | Ouyang | ...................... | 361/687 |

* cited by examiner

*Primary Examiner*—J. F Duverne
(74) *Attorney, Agent, or Firm*—Osha Liang LLP

(57) ABSTRACT

A heat sink has a plurality of pipes that are connected to an array of magnets. The plurality of pipes are connected to a lid that is operatively connected to an integrated circuit. Temperature sensors are disposed on the lid to measure temperatures of hot spots of the integrated circuit. Dependent on a temperature of one of the hot spots, the array of magnets may be used to propagate thermally conductive fluid toward the hot spot through the lid using the plurality of pipes.

20 Claims, 9 Drawing Sheets

HEAT SINK HAVING MAGNET ARRAY FOR MAGNETO-HYDRODYNAMIC HOT SPOT COOLING

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises: an integrated circuit; a lid disposed over the integrated circuit; a plurality of temperature sensors disposed on the lid and arranged to measure temperatures of hot spots of the integrated circuit; and a heat sink operatively connected to the lid, the heat sink comprising a plurality of pipes operatively connected to the plurality of temperature sensors; and a magnet array operatively connected to the plurality of pipes and arranged to propagate fluid toward at least one of the hot spots using the plurality of pipes dependent on a temperature of the at least one hot spot.

According to another aspect of one or more embodiments of the present invention, a method of cooling an hot spot of an integrated circuit comprises: generating a plurality of magnetic fields using an array of magnets; inducing electrical currents through the plurality of magnetic fields; using a plurality of pipes to pass electrically and thermally conductive fluid through the plurality of magnetic fields; propagating fluid toward the hot spot using the plurality of pipes dependent on a temperature of the hot spot; measuring the temperature of the hot spot; and adjusting at least one of the electrical currents dependent on the measuring.

According to another aspect of one or more embodiments of the present invention, an apparatus comprises: a body having a plurality of fins configured to dissipate heat; a plurality of pipes extending through the body and arranged to propagate electrically and thermally conductive fluid; an enclosure having a cavity operatively connected to the plurality of pipes; a plurality of temperature sensors disposed along a surface of the enclosure, where the temperature sensors are arranged to measure temperatures of hot spots of an integrated circuit operatively connected to the enclosure; and an array of magnets arranged in a housing operatively connected to the plurality of pipes and further arranged to propagate fluid toward at least one of the hot spots through the cavity using the plurality of pipes dependent on a temperature of the at least one hot spot.

Other aspects and advantages of the invention will be apparent from the following description and the appended claims.

DETAILED DESCRIPTION

Figure 1:
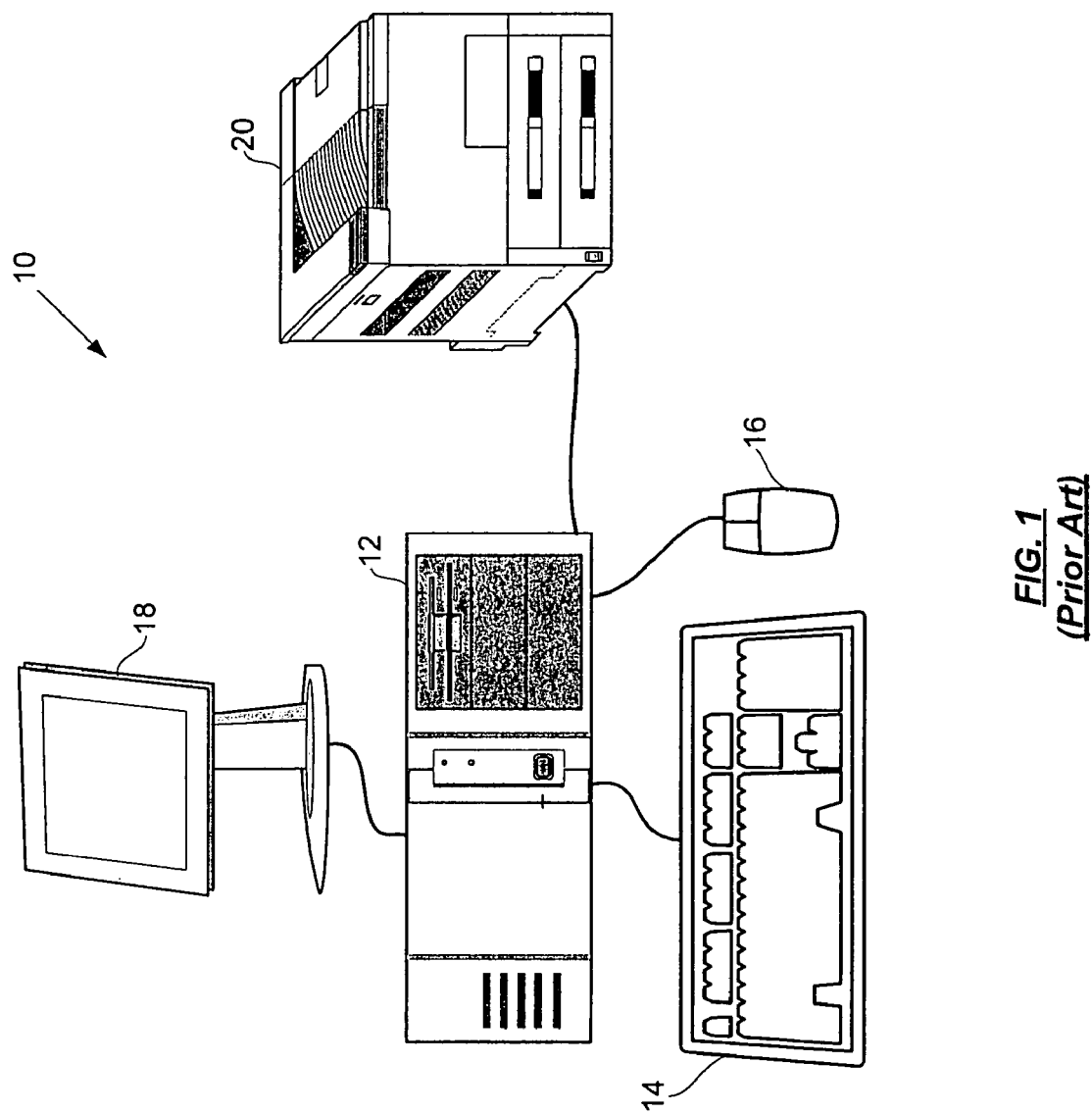
FIG. 1 shows a computer system.
Figure 2:
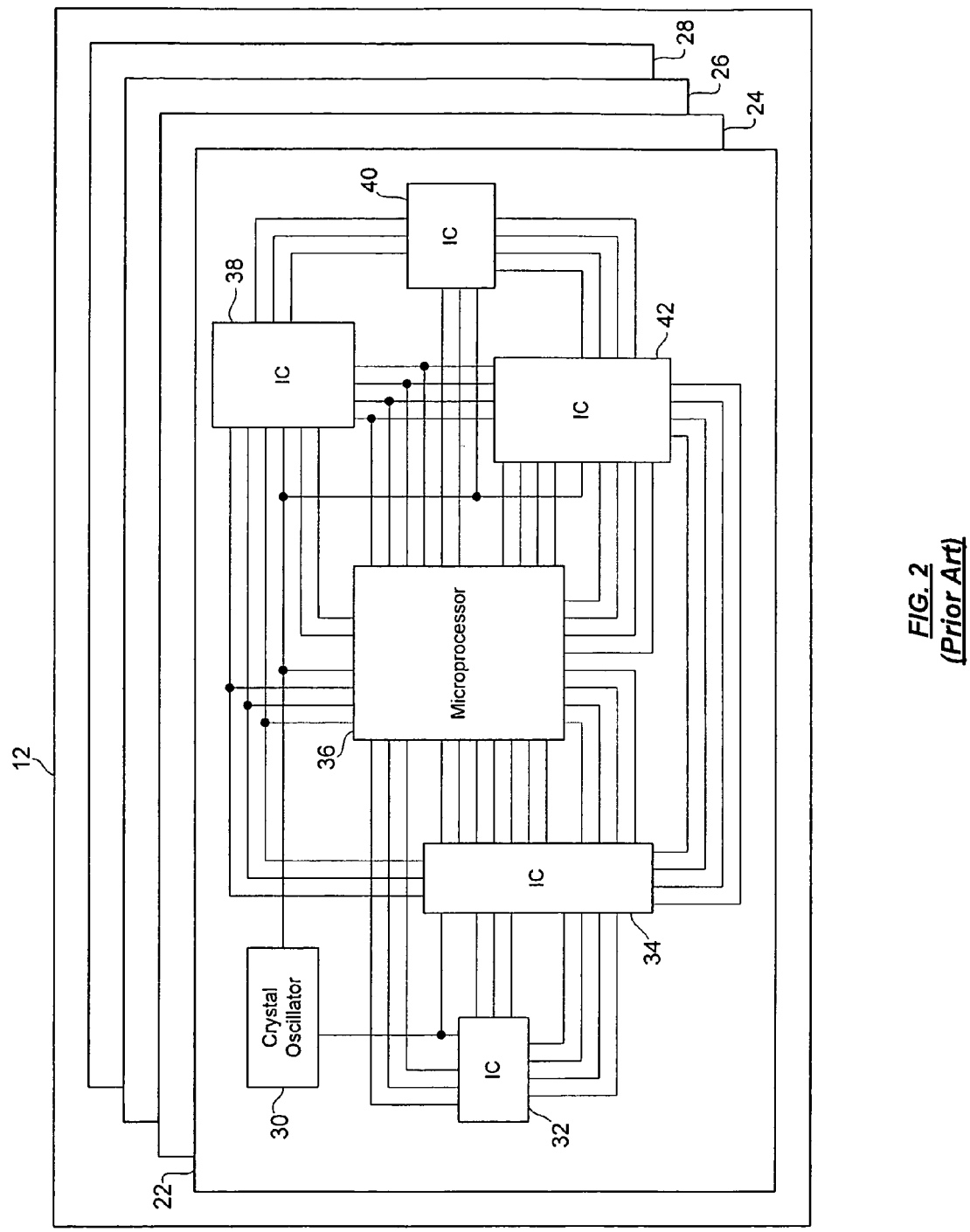
FIG. 2 shows a portion of a computer system.
Figure 3:
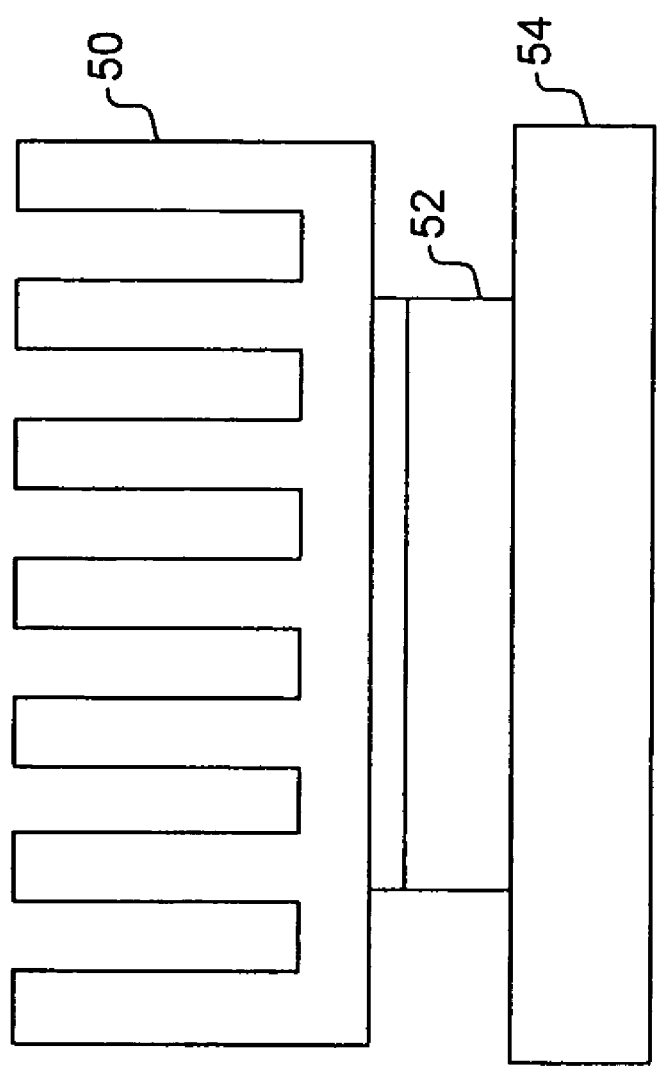
FIG. 3 shows a heat sink as used with an integrated circuit.

As described above, a heat sink is used to transfer heat away from a heat source, such as an integrated circuit. A typical heat sink is designed to uniformly transfer heat away from an integrated circuit (i.e., a typical heat sink is arranged to cool down an integrated circuit across an entire area of the integrated circuit). However, during operation of an integrated circuit, a temperature at one region of the integrated circuit may differ from a temperature at another region of the integrated circuit. In other words, the various regions of an integrated circuit do not necessarily have the same operating temperature. Instead, some regions, herein individually referred to as a "hot spot," operate at temperatures higher than other regions. Such differences in temperature across an integrated circuit result from higher power consumption at certain regions of the integrated circuit. For example, a region of the integrated circuit that drives a frequently switching signal likely consumes more power than a region of the integrated circuit that drives a constant signal.

While typical heat sinks are designed to uniformly cool across an integrated circuit as described above, embodiments of the present invention relate to a heat sink that is designed to specifically cool one or more hot spots of an integrated circuit. Generally, in one or more embodiments of the present invention, such a heat sink uses one or more pipes that carry fluid with a flow dependent on a magnetic field. Such a pipe is herein referred to as a "magneto-hydrodynamic" pipe.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the invention. In other instances, well-known features have not been described in detail to avoid obscuring the description of embodiments of the present invention.

Figure 4:
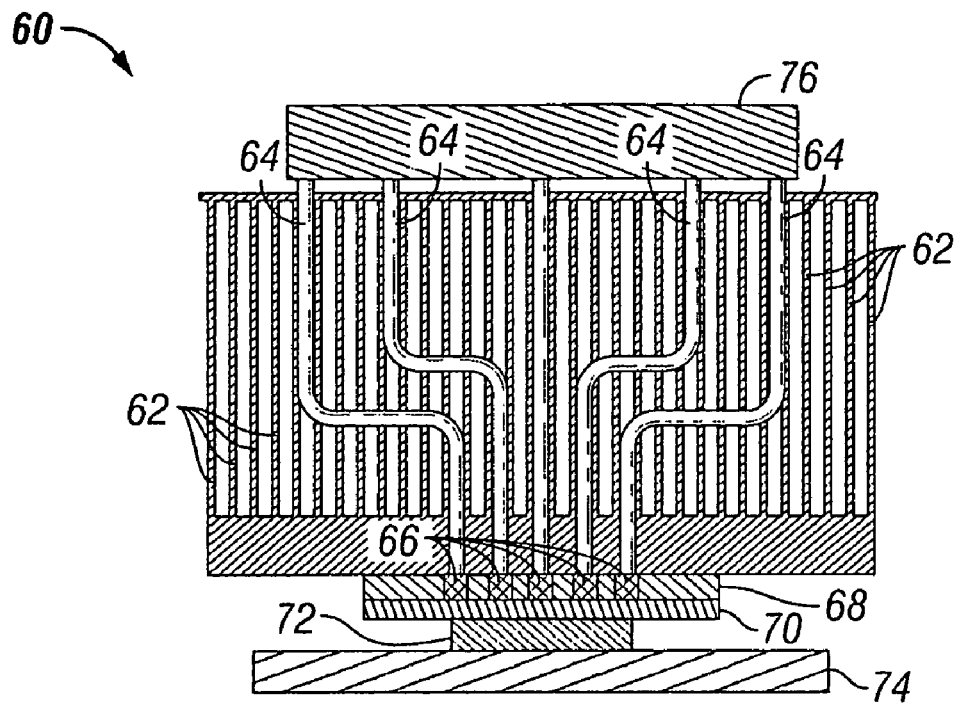
FIG. 4 shows a heat sink in accordance with an embodiment of the present invention.

FIG. 4 shows an example of a heat sink 60 in accordance with an embodiment of the present invention. The heat sink 60 has a plurality of "fins" 62 allowing for and facilitating the dissipation of heat away from the heat sink 60. A plurality of magneto-hydrodynamic pipes 64 are also provided with the heat sink 60. Those skilled in the art will note that in one or more embodiments of the present invention, the magneto-hydrodynamic pipes 64 may be integral with a body of the heat sink 60.

One end of each of the magneto-hydrodynamic pipes 64 is associated with a temperature sensor 66 embedded in a thermal interface material 68 disposed on a lid 70 positioned over an integrated circuit 72 and substrate 74. One another end of each of the magneto-hydrodynamic pipes 64 is operatively connected to a magnet array 76 that is further described below with reference to FIGS. 6A, 6B, 6C, 6D, 6E, and 7. As referred to herein, an "array" of magnets is any arrangement or combination of magnets.

Each temperature sensor 66 is configured to measure/sense a temperature at a particular location of the integrated circuit 72. Further, those skilled in the art will note that the sizing and arrangement of one or more of the temperature sensors 66, the thermal interface material 68, and the lid 70 may be adjusted so as to improve the accuracy of temperature measurements taken by one or more of the temperature sensors 66.

Figure 5:
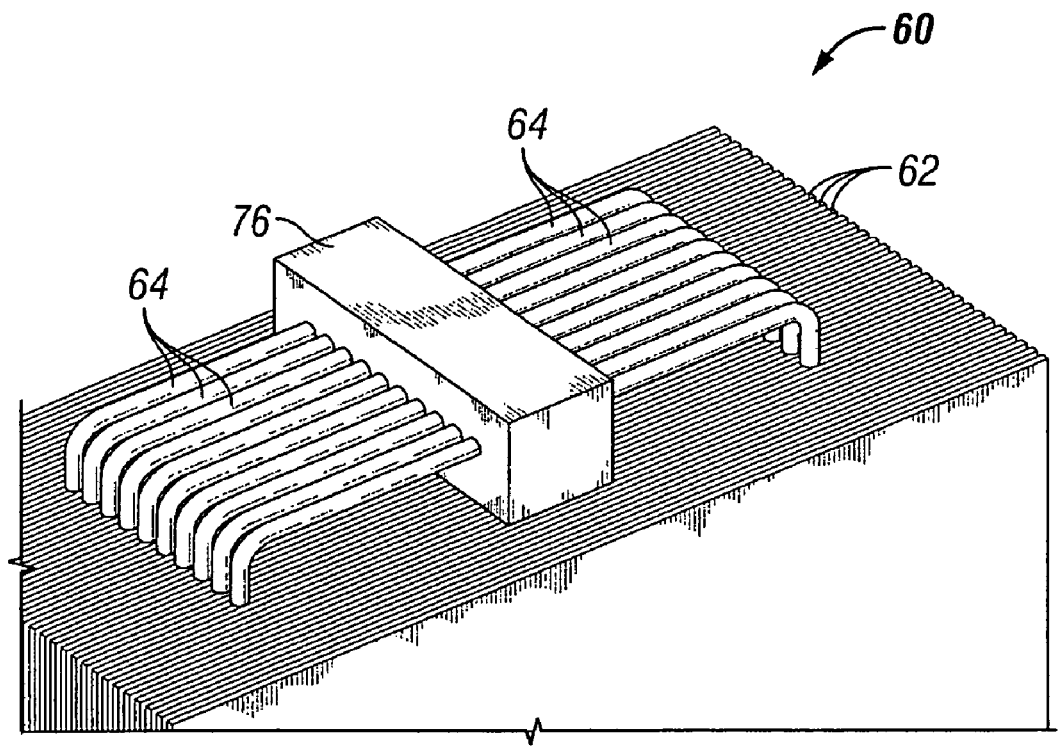
FIG. 5 shows a top-side view of a heat sink in accordance with an embodiment of the present invention.

FIG. 5 shows a top-side perspective view of heat sink 60 in accordance an embodiment of the present invention. As shown in FIG. 5, magnet array 76 protrudes from a body of the heat sink 60. Those skilled in the art will note that such an arrangement may result in the magnet array 76 being subject to a lesser amount of heat than if the magnet array 76 was arranged within the body of the heat sink 60.

In one or more embodiments of the present invention, one or more of fins 62, magneto-hydrodynamic pipes 64, and lid 70 may be formed of a thermally conductive material. For example, one or more of fins 62, magneto-hydrodynamic pipes 64, and lid 70 may be formed of copper.

Further, in one or more embodiments of the present invention, a heat sink may have a different fin configuration than that shown in FIGS. 4 and 5. Moreover, those skilled in the art will note that the heat sink 60 shown in FIGS. 4 and 5 is not necessarily to scale and is not limited to a particular length, width, and/or height.

Further, although the heat sink 60 shown in FIGS. 4 and 5 has five magneto-hydrodynamic pipes 64, in one or more other embodiments of the present invention, a different number of magneto-hydrodynamic pipes may be used.

Figure 6A:
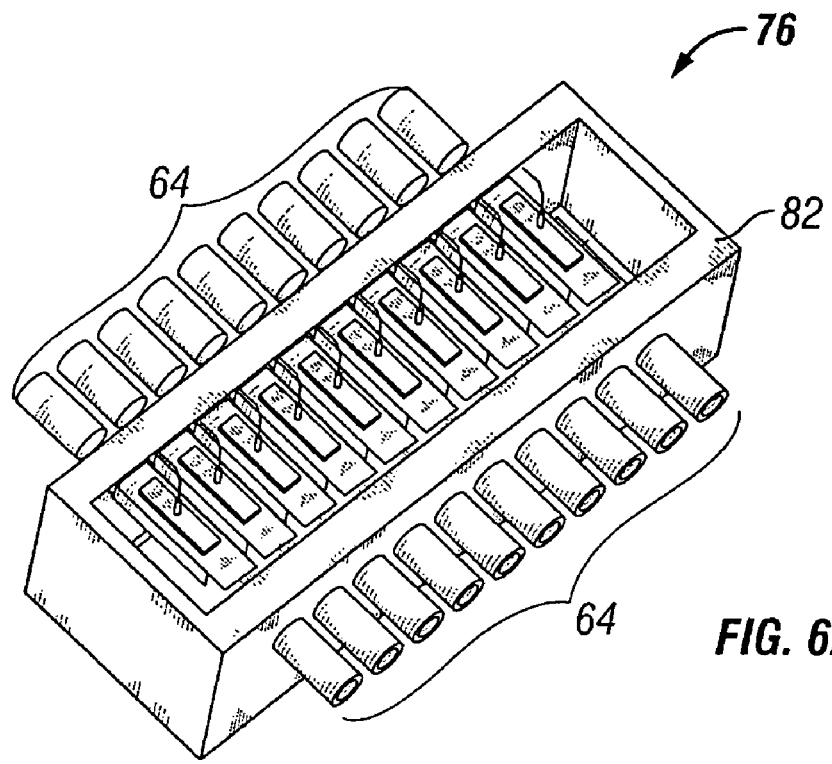
FIG. 6A shows a portion of a heat sink in accordance with an embodiment of the present invention.

FIGS. 6A, 6B, 6C, 6D, and 6E show portions of heat sink 60 in accordance with one or more embodiments of the present invention. Particularly, FIG. 6A shows an example of a configuration of magnet array 76. The magnet array 76 is formed of an arrangement of sections of magneto-hydrodynamic pipes 64. A ferromagnetic metal piece 82 is arranged to house the magnet array 76. Further, in one or more embodiments of the present invention, the magnet array 76 may be housed in a housing that is rectangular in shape.

Figure 6B:
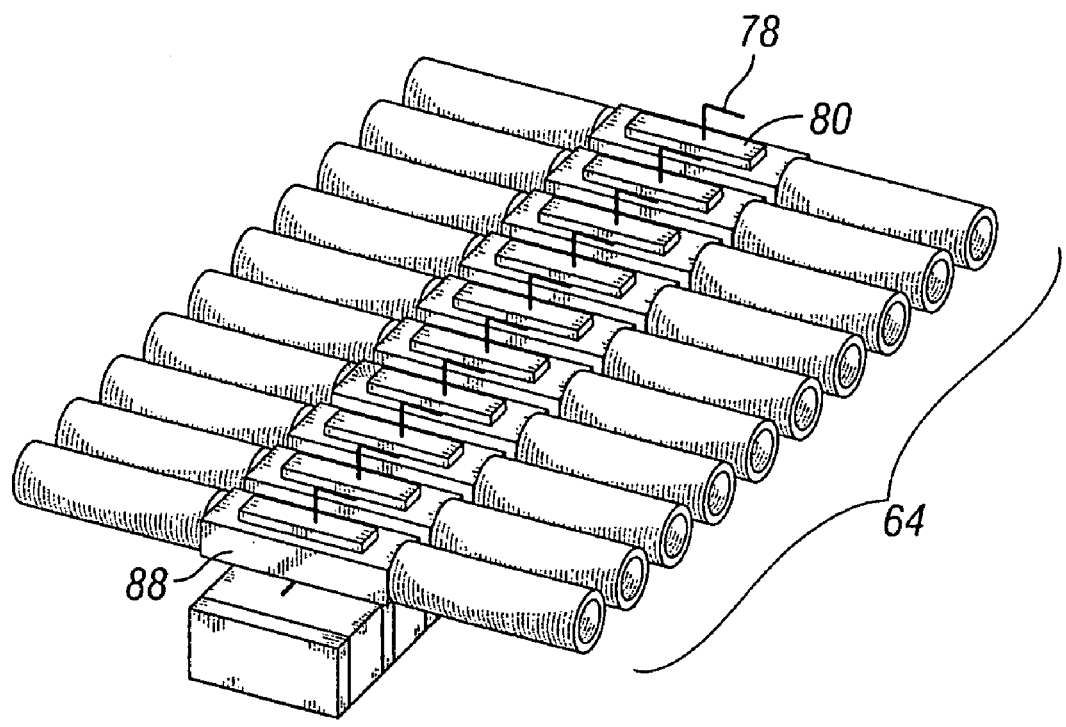
FIG. 6B shows a portion of a heat sink in accordance with an embodiment of the present invention.

As shown in FIG. 6B, a first electrical conductor 80 is disposed along an electrically non-conductive segment (e.g., plastic) 88 of each of the magneto-hydrodynamic pipes 64 that is in the magnet array 76. A second electrical conductor (not shown) is further disposed along another portion of the electrically non-conductive segment 88 of each of the magneto-hydrodynamic pipes 64. Those skilled in the art will note that in one or more embodiments of the present invention, the first electrical conductor 80 and the second electrical conductor (not shown) may be formed of, for example, copper. Further, a wire 78 arranged to carry a current or apply a voltage is connected to each of the first electrical conductor 80 and the second electrical conductor (not shown).

Figure 6C:
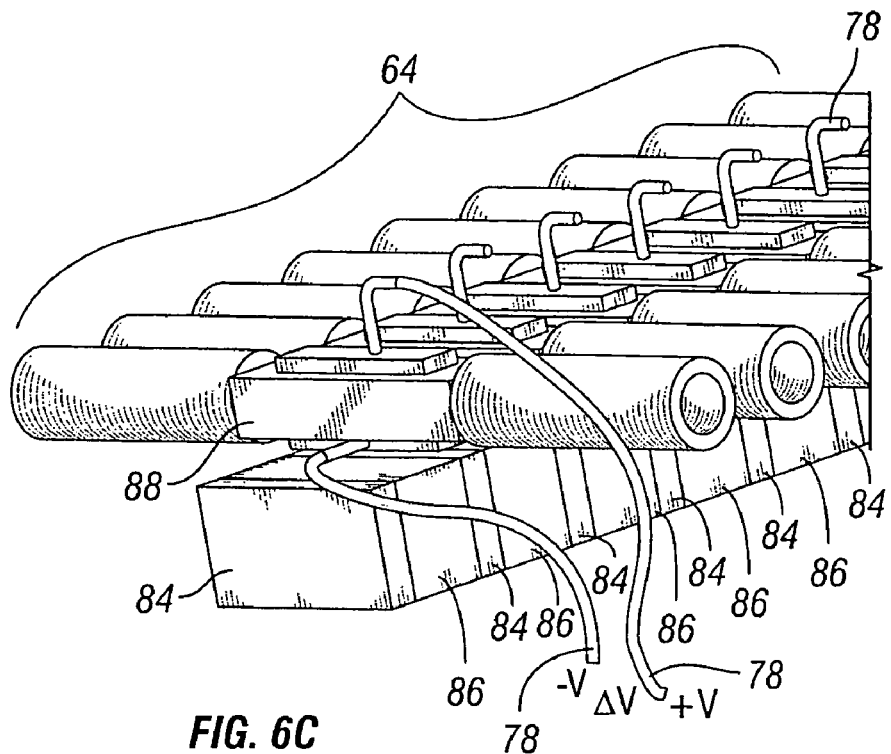
FIG. 6C shows a portion of a heat sink in accordance with an embodiment of the present invention.

Now referring to FIG. 6C, each of the magneto-hydrodynamic pipes 64 is disposed near a magnet 86. Non-metal spacers 84 are disposed between magnets 86 to ensure the separation between the magnets 86. Further, as described above and as shown in FIG. 6C, the magneto-hydrodynamic pipes 64 have electrically non-conductive segments 88 in a region of the magnet array 76.

Figure 6D:
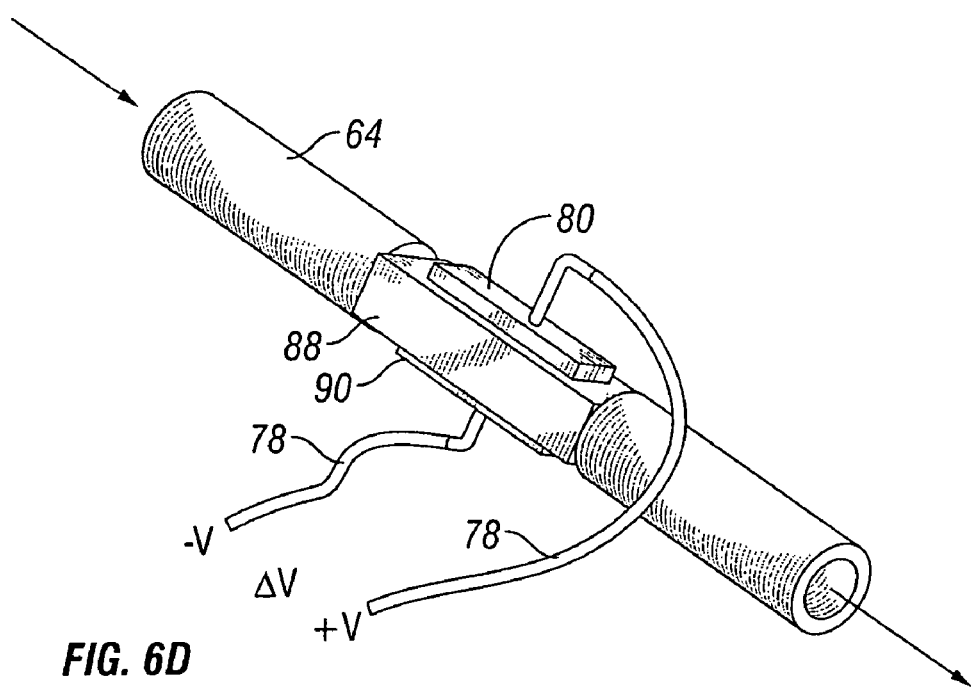
FIG. 6D shows a portion of a heat sink in accordance with an embodiment of the present invention.

For purposes of clarity, an individual magneto-hydrodynamic pipe 64 is shown in FIG. 6D. An electric current is induced across the magneto-hydrodynamic pipe 64 by creating a voltage potential difference between the first electrical conductor 80 and the second electrical conductor 90. Those skilled in the art will note that such a voltage potential difference may be realized by applying a voltage on one of the first electrical conductor 80 and the second electrical conductor 90 that is higher than that applied to the other of the first electrical conductor 80 and the second electrical conductor 90.

Figure 6E:
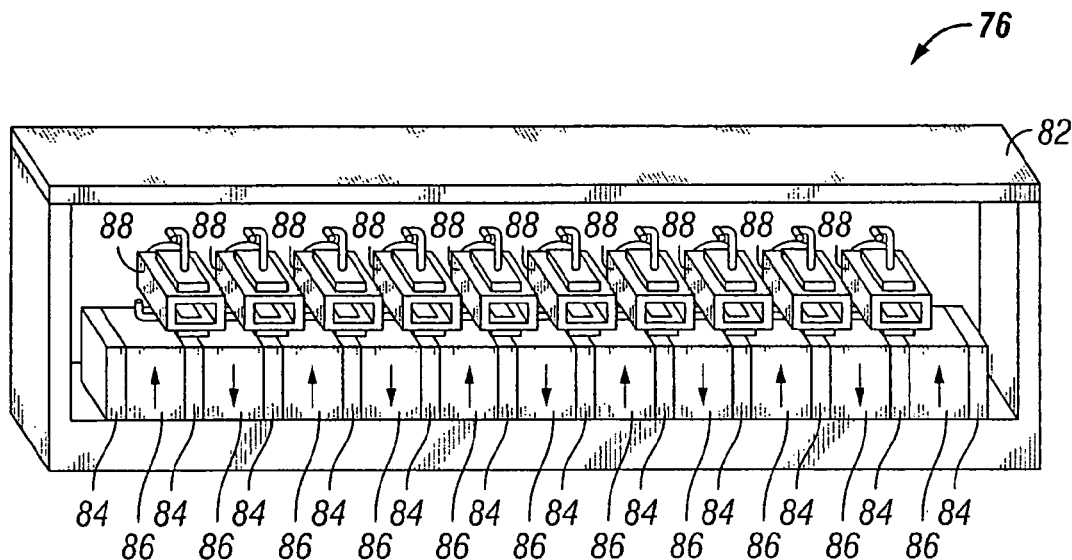
FIG. 6E shows a portion of a heat sink in accordance with an embodiment of the present invention.

FIG. 6E shows a side cross-section of magnet array 76. Particularly, FIG. 6E shows an example of a magnetization polarization direction that may be effectuated in the magnet array 76 (direction of magnetization polarization shown by arrows in FIG. 6E). Those skilled in the art will note that various sizes and strengths of magnets may be used.

Figure 7:
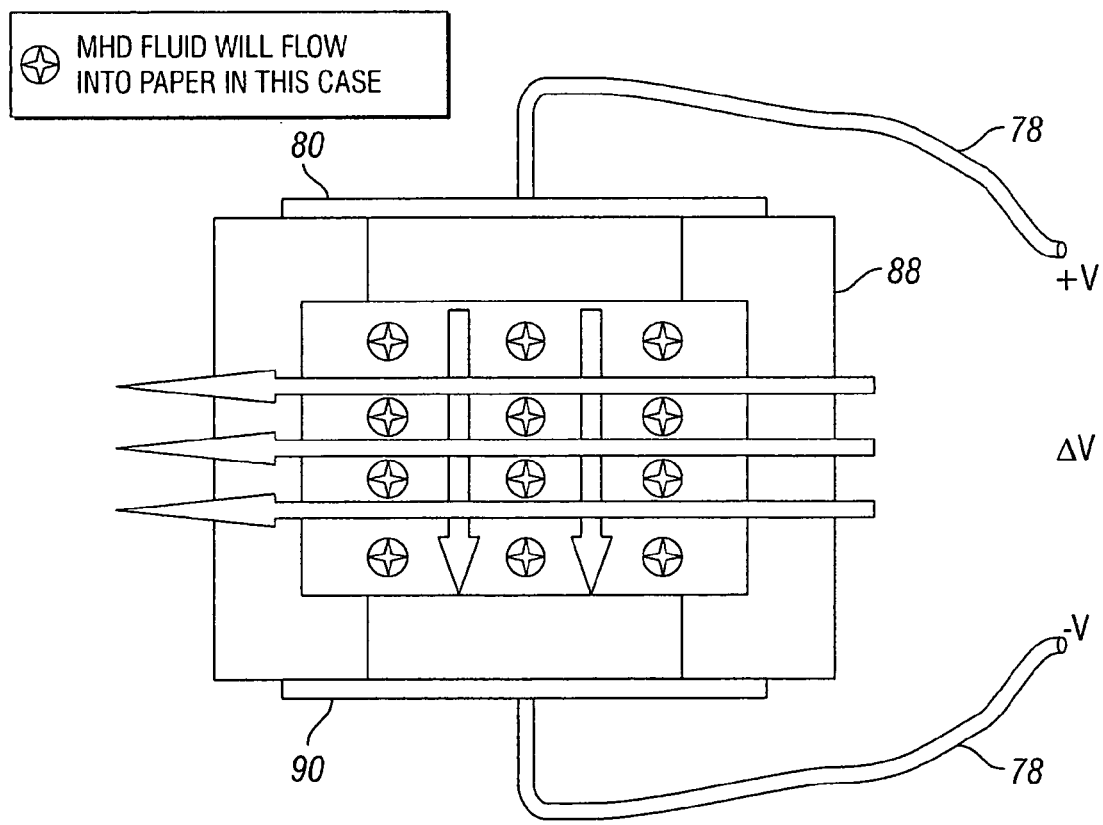
FIG. 7 shows a portion of a heat sink in accordance with an embodiment of the present invention.

FIG. 7 shows a portion of heat sink 60 in accordance with an embodiment of the present invention. The flow of fluid through the electrically non-conductive segment 88 of a magneto-hydrodynamic pipe (not shown) is dependent on a magnetic field induced between the magnets (now shown in FIG. 7, but shown in FIG. 6C as 86) arranged in the magnet array 76 (a direction of the magnetic field is indicated by the right-to-left arrows shown in FIG. 7).

The flow of fluid through the electrically non-conductive segment 88 is also dependent on an electrical current induced between the first electrical conductor 80 and the second electrical conductor 90 (a direction of electrical current flow is indicated by the top-to-bottom arrows shown in FIG. 7). Based on the direction of the magnetic field and the flow of the induced electrical current, fluid in the electrically non-conductive segment 88 flows into a plane of the sheet showing FIG. 7. However, those skilled in the art will note that in one or more other embodiments of the present invention, a direction of fluid flow may be reversed by one of reversing the direction of the magnetic field or reversing the direction of the induced electrical current.

Further, those skilled in the art will note that a rate of fluid flow may be adjusted dependent on the size and strength of magnets used to induce a magnetic field across the fluid. Further still, those skilled in the art will note that a rate of fluid flow may be adjusted dependent on a value of the electrical current induced across the fluid. Those skilled in the art will note that in order to effectuate desired fluid flow behavior dependent on the induced electrical current, the fluid should be electrically conductive.

As described above, for example, with reference to FIG. 4, the magneto-hydrodynamic pipes 64 described above are operatively connected to and/or associated with a temperature sensor 66 disposed on the lid 70. As further described above, each of the temperature sensors 66 is arranged to take temperature measurements of a hot spot of the integrated circuit 72 disposed underneath the lid 70.

Figure 8A:
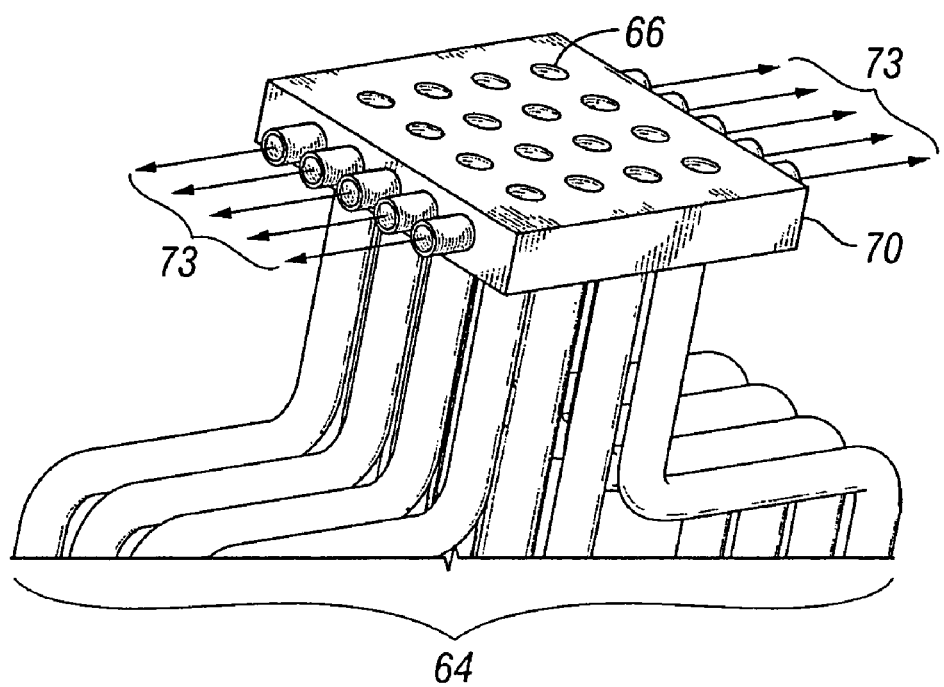
FIG. 8A shows a portion of a heat sink in accordance with an embodiment of the present invention.
Figure 8B:
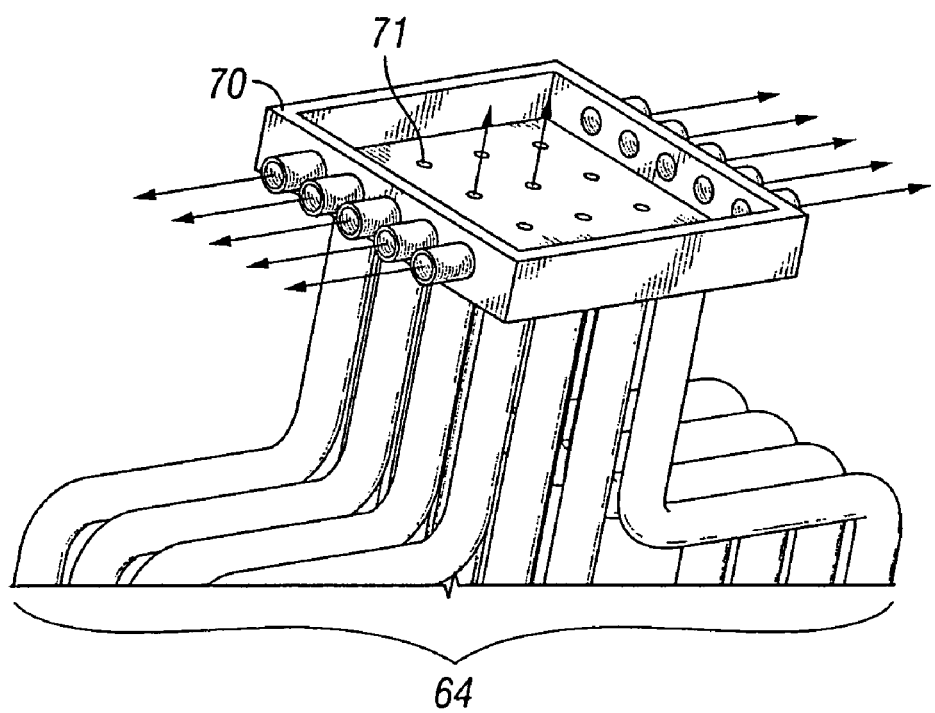
FIG. 8B shows a portion of a heat sink in accordance with an embodiment of the present invention.

FIGS. 8A and 8B show a portion of heat sink 60 in accordance with one or more embodiments of the present invention. Particularly, FIG. 8A shows a bottom side of an enclosure member 70, where temperature sensors 66 are disposed along the bottom side of the enclosure member 70. The enclosure member 70 forms a cavity 71 as shown in FIG. 8B whereby fluid propagated to one or more hot spots enters the cavity 71 and exits via pipes 73 operatively connected along the sides of the enclosure member 71 (direction of fluid flow exiting the cavity 71 indicated by the arrows shown in FIGS. 8A and 8B).

Those skilled in the art will note that using the enclosure member 70 configuration shown in FIGS. 8A and 8B, the rate of fluid flow toward one or more hot spots may be increased. In other words, the presence of the cavity 71 in the enclosure member 70 allows for the pooling of a larger volume fluid; thus, fluid flow to the cavity 71 may be increased when needed to cool down one or more particular hot spots.

As described above, a magneto-hydrodynamic pipe in a heat sink in accordance with one or more embodiments of the present invention has an end that is associated with a temperature sensor on a lid disposed over an integrated circuit. By using the temperature readings taken by the temperature sensor, a magnet array of the heat sink may be adjusted so as to effectuate a desired response with respect to hot spot cooling.

Figure 9:
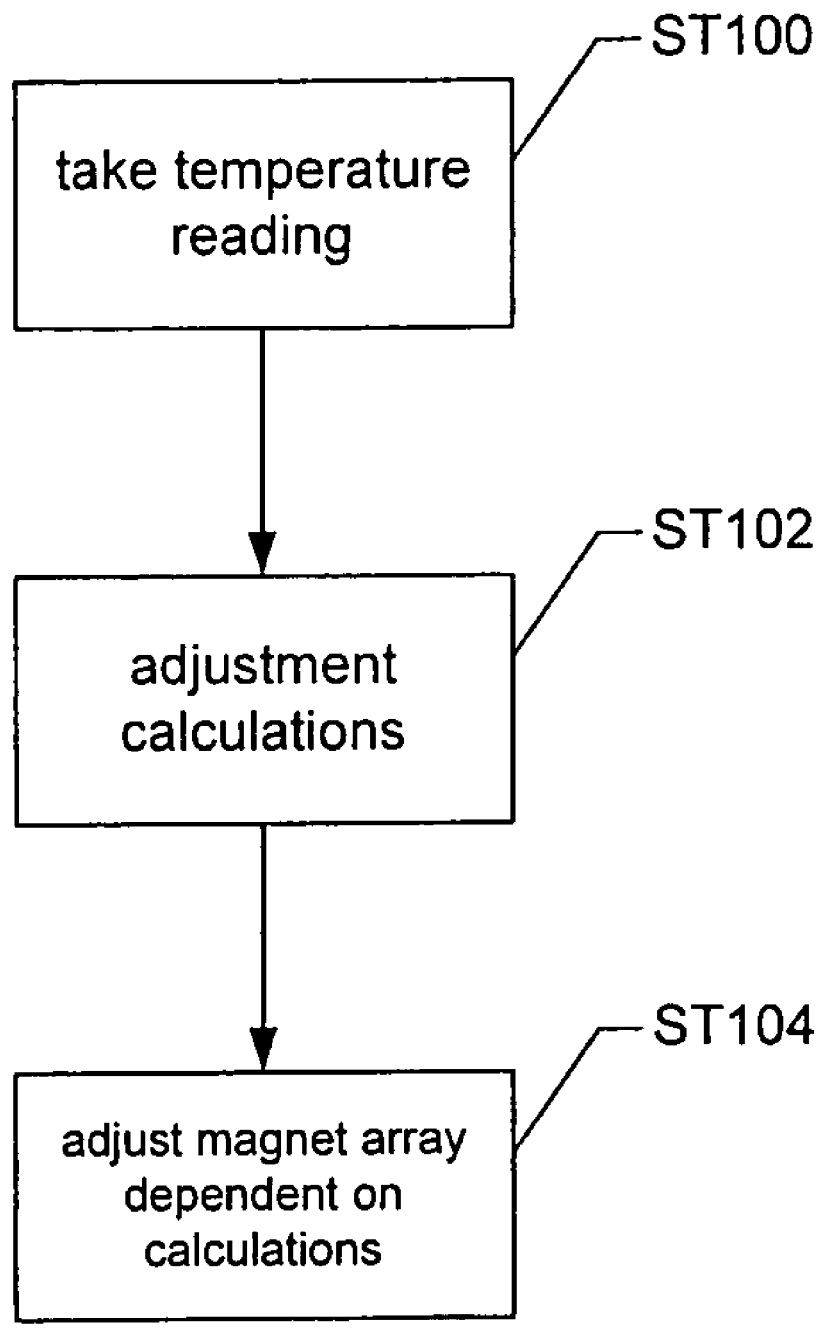
FIG. 9 shows a flow process in accordance with an embodiment of the present invention.

FIG. 9 shows an example of a flow process in accordance with an embodiment of the present invention. In FIG. 9, a temperature sensor is used to take a temperature reading at a location of an integrated circuit ST100. The temperature reading may be transmitted to, for example, a control module that calculates certain adjustments based on the temperature reading ST102. The adjustments may be made in reliance on assuming that ambient air flow conditions and/or heat sink parameters remain constant. In such a manner, the parameters associated with a magnet array of the heat sink may be adjusted without being dependent on varying ambient or heat sink conditions.

In ST104, adjustments to the magnet array of the heat sink are made based on the calculations in ST102. These adjustments may involve, for example, adjusting an electrical current induced across fluid in one or more segments in the magnet array. In such a manner, the rate of fluid flow may be adjusted so as to more quickly or more slowly dissipate heat away from one or more hot spots.

Those skilled in the art will note that the control module may be any device or medium usable to make adjustment calculations. For example, the control module may be part of another integrated circuit or may be a software module executable by the integrated circuit being cooled.

Advantages of the present invention may include one or more of the following. In one or more embodiments of the present invention, one or more hot spots of an integrated circuit may be cooled dependent on a feedback response based on a current temperature at the one or more hot spots.

In one or more embodiments of the present invention, a flow of thermally conductive fluid used to cool one or more hot spots of an integrated circuit may be controlled so as to effectuate a desired level of cooling.

In one or more embodiments of the present invention, a magnet array for driving the flow of fluid used to cool one or more hot spots of an integrated circuit resides outside of a body of the a heat sink, thereby exposing the magnet array to air that is cooler than that flowing within the body of the heat sink.

In one or more embodiments of the present invention, a magnet array may be used to have multiple channels cool across an area of an integrated circuit, where the magnet array may also be used to more directly cool a hot spot of an integrated circuit.

In one or more embodiments of the present invention, a magnetic field used to drive the flow of fluid used to cool one or more hot spots of an integrated circuit may be shielded so as to prevent magnetic field interference.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   an integrated circuit;
   a lid disposed over the integrated circuit;
   a plurality of temperature sensors disposed on the lid and arranged to measure temperatures of hot spots of the integrated circuit; and
   a heat sink operatively connected to the lid, the heat sink comprising a plurality of pipes operatively connected to the plurality of temperature sensors; and
   a magnet array operatively connected to the plurality of pipes and arranged to propagate fluid toward at least one of the hot spots using the plurality of pipes dependent on a temperature of the at least one hot spot.

2. The computer system of claim 1, further comprising:
   an enclosure to which the plurality of pipes propagate the fluid.

3. The computer system of claim 1, the magnet array comprising:
   a first electrical conductor disposed along a electrically non-conductive segment of one of the plurality of pipes; and
   a second electrical conductor disposed along the electrically non-conductive segment,
   wherein fluid flow within the electrically non-conductive segment is dependent on an electrical current induced between the first electrical conductor and the second electrical conductor.

4. The computer system of claim 3, wherein the induced electrical current is dependent on at least one of the plurality of temperature sensors.

5. The computer system of claim 1, the magnet array comprising:
   a plurality of magnets;
   a plurality of non-metal spacers interspersed between the plurality of magnets,
   wherein polarization directions of the plurality of magnetic fields are dependent on the plurality of magnets.

6. The computer system of claim 5, the magnet array further comprising:
   an electrically non-conductive segment of one of the plurality of pipes, where the electrically non-conductive segment is disposed over at least one of the plurality of magnets and at least one of the plurality of non-metal spacers.

7. The computer system of claim 6, wherein the electrically non-conductive segment is formed of plastic.

8. The computer system of claim 1, further comprising:
   a ferromagnetic metal piece arranged to at least partially shield the plurality of magnetic fields.

9. The computer system of claim 1, wherein the magnet array is disposed outside a body of the heat sink.

10. The computer system of claim 1, wherein fluid flow in each of the plurality of pipes is individually controllable.

11. The computer system of claim 1, wherein the magnet array is rectangular in shape.

12. The computer system of claim 1, wherein the fluid is at least one of thermally and electrically conductive.

13. A method of cooling an hot spot of an integrated circuit, comprising:
    generating a plurality of magnetic fields using an array of magnets;
    inducing electrical currents through the plurality of magnetic fields;
    using a plurality of pipes to pass electrically and thermally conductive fluid through the plurality of magnetic fields;
    propagating fluid toward the hot spot using the plurality of pipes dependent on a temperature of the hot spot;
    measuring the temperature of the hot spot; and
    adjusting at least one of the electrical currents dependent on the measuring.

14. The method of claim 13, further comprising:
    at least partially shielding the plurality of magnetic fields.

15. The method of claim 13, wherein a rate of flow of the fluid is dependent on at least one of the electrical currents.

16. An apparatus, comprising:
    a body having a plurality of fins configured to dissipate heat;
    a plurality of pipes extending through the body and arranged to propagate electrically and thermally conductive fluid;
    an enclosure having a cavity operatively connected to the plurality of pipes;
    a plurality of temperature sensors disposed along a surface of the enclosure, wherein the temperature sensors are arranged to measure temperatures of hot spots of an integrated circuit operatively connected to the enclosure; and
    an array of magnets arranged in a housing operatively connected to the plurality of pipes and further arranged to propagate fluid toward at least one of the hot spots through the cavity using the plurality of pipes dependent on a temperature of the at least one hot spot.

17. The heat sink of claim 16, wherein fluid flow is dependent on at least one of a plurality of magnetic fields induced between the magnets.

18. The heat sink of claim 17, wherein fluid flow is dependent on an electrical current induced across one of the plurality of magnetic fields.

19. The heat sink of claim 16, further comprising:
    a ferromagnetic metal piece arranged to at least partially shield the plurality of magnetic fields.

20. The heat sink of claim 16, wherein the housing is disposed outside the body.

* * * * *